United States Patent
Murray et al.

(10) Patent No.: US 10,424,504 B2
(45) Date of Patent: Sep. 24, 2019

(54) METHOD FOR FORMING IMPROVED LINER LAYER AND SEMICONDUCTOR DEVICE INCLUDING THE SAME

(71) Applicant: International Business Machines Corporation, Armonk, NY (US)

(72) Inventors: Conal E. Murray, Yorktown Heights, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/705,426

(22) Filed: Sep. 15, 2017

(65) Prior Publication Data

US 2018/0019164 A1     Jan. 18, 2018

Related U.S. Application Data

(62) Division of application No. 15/210,437, filed on Jul. 14, 2016, now Pat. No. 9,859,157.

(51) Int. Cl.

| | |
|---|---|
| *H01L 23/48* | (2006.01) |
| *H01L 23/52* | (2006.01) |
| *H01L 21/768* | (2006.01) |
| *H01L 21/28* | (2006.01) |
| *H01L 29/49* | (2006.01) |
| *H01L 21/285* | (2006.01) |

(52) U.S. Cl.
CPC .. *H01L 21/76864* (2013.01); *H01L 21/28088* (2013.01); *H01L 21/76843* (2013.01); *H01L 29/4966* (2013.01); *H01L 21/28562* (2013.01)

(58) Field of Classification Search
CPC ......... H01L 21/76831; H01L 21/76841; H01L 21/76852; H01L 21/76856; H01L 21/76864; H01L 21/28088
USPC .......................................................... 257/751
See application file for complete search history.

(56) References Cited

U.S. PATENT DOCUMENTS

| | | | |
|---|---|---|---|
| 6,858,524 | B2 | 2/2005 | Haukka et al. |
| 7,067,409 | B2 | 6/2006 | Tsai et al. |
| 7,354,332 | B2 | 4/2008 | Surana et al. |
| 7,356,377 | B2 | 4/2008 | Schwarm |
| 7,393,736 | B2 | 7/2008 | Ahn et al. |
| 7,455,720 | B2 | 11/2008 | Gu |

(Continued)

FOREIGN PATENT DOCUMENTS

WO        03028090 A2     4/2003

OTHER PUBLICATIONS

List of IBM Patents or Patent Applications Treated as Related.

*Primary Examiner* — Theresa T Doan
(74) *Attorney, Agent, or Firm* — Vazken Alexanian; Ryan, Mason & Lewis, LLP

(57) ABSTRACT

A method for manufacturing a semiconductor device includes conformally depositing a liner layer on a top surface of a dielectric layer, and on sidewall and bottom surfaces of an opening in the dielectric layer, annealing the liner layer, wherein the annealing is performed in at least one of a nitrogen ($N_2$) and ammonia ($NH_3$) ambient, at a temperature of about 60° C. to about 500° C., and at a power of about 200. Watts to about 4500. Watts, and forming a conductive layer on the liner layer on the top surface of the dielectric layer, and on the liner layer in a remaining portion of the opening.

18 Claims, 4 Drawing Sheets

(56) References Cited

U.S. PATENT DOCUMENTS

| | | |
|---|---|---|
| 7,473,637 B2 | 1/2009 | Kraus et al. |
| 7,583,534 B2 | 9/2009 | Forbes et al. |
| 7,589,020 B2 | 9/2009 | Hasegawa |
| 7,618,893 B2 | 11/2009 | Fu et al. |
| 7,629,256 B2 | 12/2009 | Hasper |
| 7,642,610 B2 | 1/2010 | Murthy et al. |
| 7,687,848 B2 | 3/2010 | Forbes et al. |
| 7,692,222 B2 | 4/2010 | Tabatabaie et al. |
| 7,698,012 B2 | 4/2010 | Shanmugasundram et al. |
| 7,713,874 B2 | 5/2010 | Milligan |
| 7,732,331 B2 | 6/2010 | Kim et al. |
| 7,736,954 B2 | 6/2010 | Hussain et al. |
| 7,741,226 B2 | 6/2010 | Andry et al. |
| 7,776,733 B2 | 8/2010 | Hasegawa |
| 7,799,135 B2 | 9/2010 | Verghese et al. |
| 7,833,914 B2 | 11/2010 | Ahn et al. |
| 7,851,324 B2 | 12/2010 | Wang et al. |
| 7,851,915 B2 | 12/2010 | Caubet et al. |
| 7,867,902 B2 | 1/2011 | Choi et al. |
| 7,868,421 B2 | 1/2011 | Won et al. |
| 7,875,912 B2 | 1/2011 | Ahn et al. |
| 7,914,847 B2 | 3/2011 | Verghese et al. |
| 7,928,006 B2 | 4/2011 | Besling |
| 8,017,182 B2 | 9/2011 | Hendriks et al. |
| 8,053,365 B2 | 11/2011 | Humayun et al. |
| 8,058,729 B2 | 11/2011 | Kraus et al. |
| 8,070,909 B2 | 12/2011 | Shanmugasundram et al. |
| 8,110,491 B2 | 2/2012 | Harada |
| 8,119,514 B2 | 2/2012 | Ahn et al. |
| 8,202,768 B2 | 6/2012 | Lander |
| 8,278,201 B2 | 10/2012 | Jang |
| 8,291,857 B2 | 10/2012 | Lam et al. |
| 8,293,015 B2 | 10/2012 | Lam et al. |
| 8,319,295 B2 | 11/2012 | Collaert et al. |
| 8,349,726 B2 | 1/2013 | Besling |
| 8,357,583 B2 | 1/2013 | Hirota et al. |
| 8,367,546 B2 | 2/2013 | Humayun et al. |
| 8,368,149 B2 | 2/2013 | Lander |
| 2001/0025999 A1* | 10/2001 | Suguro ............... H01L 21/2652 257/410 |
| 2005/0112876 A1 | 5/2005 | Wu et al. |
| 2006/0216932 A1* | 9/2006 | Kumar ................... C23C 14/02 438/641 |
| 2008/0188055 A1 | 8/2008 | Wang et al. |
| 2009/0039433 A1 | 2/2009 | Yang et al. |
| 2009/0131245 A1 | 5/2009 | Esconjauregui et al. |
| 2010/0181630 A1* | 7/2010 | Bu .................... H01L 21/28079 257/410 |
| 2010/0327364 A1 | 12/2010 | Tsuchiya |
| 2011/0079878 A1 | 4/2011 | Aggarwal et al. |
| 2012/0252207 A1 | 10/2012 | Lei et al. |
| 2013/0260555 A1 | 10/2013 | Zope et al. |
| 2013/0264620 A1* | 10/2013 | Yu .................... H01L 23/53238 257/295 |

* cited by examiner

METHOD FOR FORMING IMPROVED LINER LAYER AND SEMICONDUCTOR DEVICE INCLUDING THE SAME

TECHNICAL FIELD

The field generally relates to semiconductor devices and methods of manufacturing same and, in particular, to using an annealing process to form an improved liner layer.

BACKGROUND

Liner layers, such as, for example, titanium nitride (TiN), are used in thin film form in a variety of applications within semiconductor technology. For example, a liner layer's ability as a diffusion barrier is important to mitigate oxygen ingress into complementary metal-oxide semiconductor (CMOS) devices and to provide a consistent work function for uniform device operation. In addition, a liner layer, such as titanium nitride, is used as an effective diffusion barrier to prevent metals (such as copper, aluminum) from contaminating surrounding dielectric materials in back-end-of-line (BEOL), front-end-of-line (FEOL), and middle-of-line (MOL) metallization. As device dimensions continue to decrease, the ability to uniformly deposit a liner layer in smaller trenches with larger aspect ratios has required different deposition techniques other than physical based deposition. These different deposition techniques result in increased levels of contamination in the liner layer thin films. The contamination is exacerbated by the need to deposit thinner films due to spatial restrictions imposed by scaling for increased miniaturization.

SUMMARY

According to an exemplary embodiment of the present invention, a method for manufacturing a semiconductor device includes conformally depositing a liner layer on a top surface of a dielectric layer, and on sidewall and bottom surfaces of an opening in the dielectric layer, annealing the liner layer, wherein the annealing is performed in at least one of a nitrogen ($N_2$) and ammonia ($NH_3$) ambient, at a temperature of about 60° C. to about 500° C., and at a power of about 200 Watts to about 4500 Watts, and forming a conductive layer on the liner layer on the top surface of the dielectric layer, and on the liner layer in a remaining portion of the opening.

According to an exemplary embodiment of the present invention, a semiconductor device includes a dielectric layer, an opening formed in the dielectric layer, a liner layer on sidewall and bottom surfaces of the opening, and a conductive layer on the liner layer in the opening, wherein the liner layer comprises titanium nitride, and a density of the liner layer is greater than about 4.5 g/cm$^3$.

According to an exemplary embodiment of the present invention, a method for manufacturing a semiconductor device includes forming a trench in a dielectric layer, and forming a conductive structure in the trench, wherein forming the conductive structure comprises conformally depositing a liner layer on sidewall and bottom surfaces of the trench, annealing the liner layer, wherein the annealing is performed in at least one of a nitrogen ($N_2$) and ammonia ($NH_3$) ambient, at a temperature of about 60° C. to about 500° C., and at a power of about 200 Watts to about 4500 Watts, and forming a conductive layer on the liner layer in the trench.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
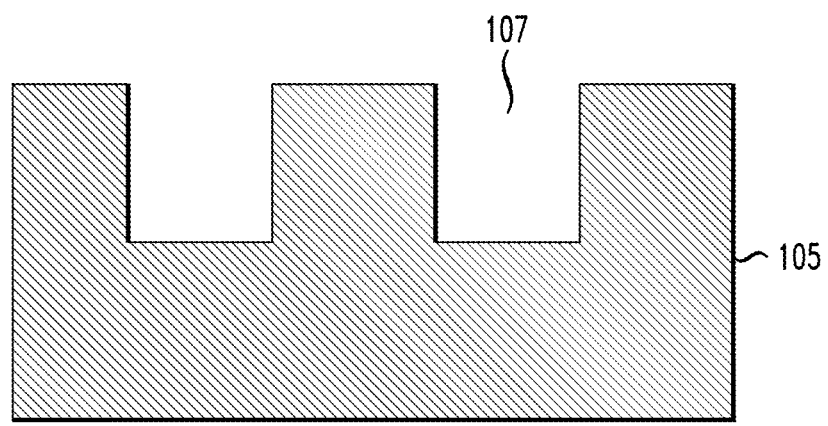
FIG. 1 is a cross-sectional view illustrating fabrication of a semiconductor device at a back-end-of-line (BEOL) or middle-of-line (MOL), and showing formation of openings in a dielectric, according to an exemplary embodiment of the present invention.

Exemplary embodiments of the invention will now be discussed in further detail with regard to semiconductor devices and methods of manufacturing same and, in particular, to using an annealing process to form an improved liner layer.

It is to be understood that the various layers and/or regions shown in the accompanying drawings are not drawn to scale, and that one or more layers and/or regions of a type commonly used in, for example, complementary metal-oxide semiconductor (CMOS), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional and three-dimensional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

According to an embodiment of the present invention, as device dimensions continue to decrease, atomic layer deposition (ALD) or chemical vapor deposition (CVD) is used to uniformly deposit liner layers, for example, titanium nitride, in smaller trenches with larger aspect ratios. ALD or CVD results in more conformal deposition, but also greater amounts of carbon impurities in the deposited film, and a less dense film since carbon is a precursor for such processes. As film thickness continues to decrease, these characteristics can lead to more variation in the work function on the liner layer surface with a decreased ability to mitigate diffusion.

As a result, embodiments of the present invention utilize deposition techniques for a liner layer such as, for example, ALD or CVD with the addition of a plasma-based, annealing procedure that improves an initial density of the film and reduces the level of organic impurities within the film, such as, for example, carbon or carbon bonded with hydrogen, oxygen or nitrogen. According to embodiments of the present invention, a more consistent stoichiometry (e.g., ratio of titanium to nitrogen in the case of a TiN film) is observed in the plasma-treated films, which leads to a more uniform work function value when compared with films that have not been subjected to the plasma-based, annealing procedure.

Accordingly, embodiments of the present invention create a denser and more stable thin film for advanced metallization related applications in FEOL, MOL, and BEOL, where the liner material is deposited using, for example, ALD or CVD techniques, and subjected to the disclosed plasma-based, annealing procedure. For example, in connection with FEOL gate metal related applications, embodiments of the present invention result in a dense and stable work function liner layer that prevents oxygen ingress from subsequent downstream fabrication in order to achieve stable device performance. For MOL contact related applications, embodiments of the present invention result in a dense and stable liner layer, which can function as a sufficient fluorine or other halogen barrier for subsequent contact processing, using, for example tungsten (W) or other materials deposited from fluorine-based or other halide-based precursors. In addition, a thickness of a dense and stable liner layer can be reduced, which may be critical for extendibility of the technology to smaller scale applications. In connection with BEOL contact related applications, embodiments of the present invention result in a dense and stable liner layer, which can function as a sufficient copper (Cu) diffusion barrier. For example, in order to improve interconnect performance, increasing the Cu volume by reducing the liner thickness can be critical.

Although embodiments of the present invention are discussed in connection with a titanium nitride liner layer, the embodiments of the present invention are not necessarily limited thereto, and can be applied with the same or similar results to thin film liner layers comprising other materials, such as, for example, titanium, tantalum, tungsten, cobalt, ruthenium, iridium, nickel, rhodium and their nitrides, oxides, silicides or other alloy materials.

In accordance with an embodiment of the present invention, a post deposition annealing procedure includes a nitridation treatment that removes nitrogen containing, organic residue in a TiN liner layer deposited by metalorganic atomic layer deposition (MOALD). As used herein, "organic residue" refers to residue (e.g., remaining by-products or contaminants) containing, for example, carbon, hydrocarbons (carbons bonded with hydrogen), and/or carbon bonded with oxygen or nitrogen. The post deposition annealing procedure densifies the TiN, and can be performed in, for example, a nitrogen ($N_2$) or ammonia ($NH_3$) ambient, using about 200 Watts (W) to about 4500 W power, for example, about 500 W to about 2000 W. The power can be applied by high-frequency voltage which ionizes the ambient gas and creates a plasma. The annealing is performed at a temperature of about 60° C. to about 500° C., for example, at about 100° C. to about 250° C., for about 1 minute to about 10 minutes, such as for example, about 2 minutes to about 5 minutes.

The post deposition annealing procedure reduces organic impurities, resulting in a high density TiN film, having a density that is greater than 4.5 g/cm$^3$. The density of the film can be measured using, for example, x-ray reflectivity (XRR). The reduction of the organic impurities occurs due to the annealing process causing a reaction between ions in the plasma and organic impurities on a top surface of the film. The organic impurities include, for example, carbon, hydrocarbons, and carbon bonded with oxygen or nitrogen, and the reaction breaks the bonds in the organic impurities and volatizes the by-products.

FIG. 1 is a cross-sectional view illustrating fabrication of a semiconductor device at a back-end-of-line (BEOL) or middle-of-line (MOL), and showing formation of openings in a dielectric, according to an exemplary embodiment of the present invention. Referring to FIG. 1, one or more openings 107 (e.g., trenches) are formed in a dielectric layer 105, such as, for example, silicon dioxide (SiO$_2$), carbon-doped silicon oxide (SiCOH), SiLK® dielectrics, and porous forms of these low-k dielectric films. The trenches 107 can be defined using, for example, lithography techniques, and then reactive ion etching (RIE) to open the trenches 107. The trenches 107 can be formed through a plurality of dielectric layers 105.

According to an embodiment, the dielectric 105 and the trenches 107 are part of a BEOL or MOL interconnect structure of an integrated circuit where the devices, including, but not limited to, transistors, capacitors, and resistors are interconnected with metallization layers (e.g., wiring) on a wafer. As can be understood by one of ordinary skill in the art, the dielectric layer 105 can be on a semiconductor substrate (not shown), with intervening layers between the dielectric layer 105 and the substrate. A semiconductor substrate can be, for example, a bulk substrate or a silicon-on-insulator (SOI) substrate including a buried insulating layer, such as, for example, a buried oxide or nitride layer located on an upper surface of the semiconductor substrate. The substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors.

Figure 2:
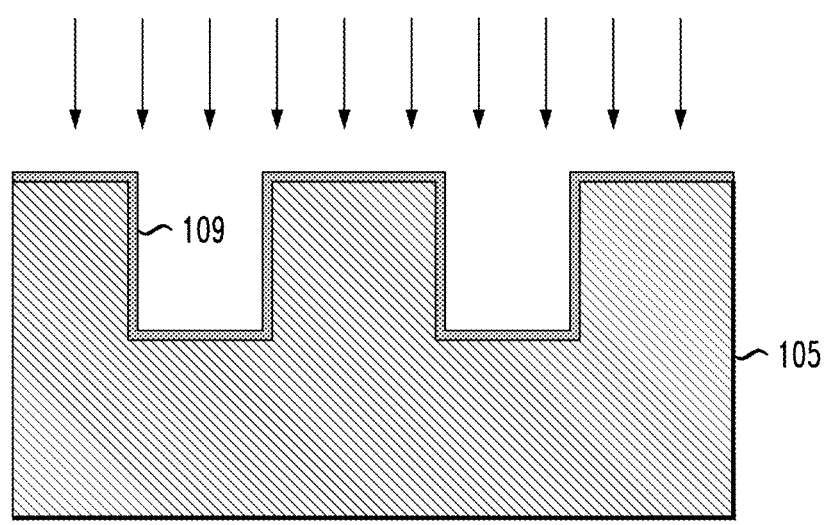
FIG. 2 is a cross-sectional view illustrating fabrication of a semiconductor device at a BEOL or MOL, and showing deposition of a liner layer followed by an annealing process to modify the liner layer, according to an exemplary embodiment of the present invention.

FIG. 2 is a cross-sectional view illustrating fabrication of a semiconductor device at a BEOL or MOL, and showing deposition of a liner layer followed by an annealing process to modify the liner layer, according to an exemplary embodiment of the present invention. Referring to FIG. 2, a liner layer 109 comprising, for example titanium nitride, or other liner material(s), is conformally formed on a top surface of the dielectric 105, and lining the sidewall and bottom surfaces of the trenches 107. Deposition can be performed using, for example ALD. Other deposition processes, such as, for example, CVD or physical vapor deposition (PVD) may also be used. A thickness of the liner layer 109 (e.g., height in the vertical direction and width in the horizontal direction) can be, but is not necessarily limited to, about 5 angstroms to about 20 nm, for example, about 5 nm to about 10 nm.

As indicated by the arrows, following deposition of the liner layer 109, a plasma-based annealing procedure is performed on the liner layer 109 at a temperature of about 60° C. to about 500° C., for example, at about 100° C. to about 250° C., for about 1 minute to about 10 minutes, such as for example, about 2 minutes to about 5 minutes in, for example, a nitrogen (N$_2$) or ammonia (NH$_3$) ambient. The plasma-based annealing procedure is performed using about 200 Watts (W) to about 4500 W of power, for example, about 500 W to about 2000 W.

Figure 3:
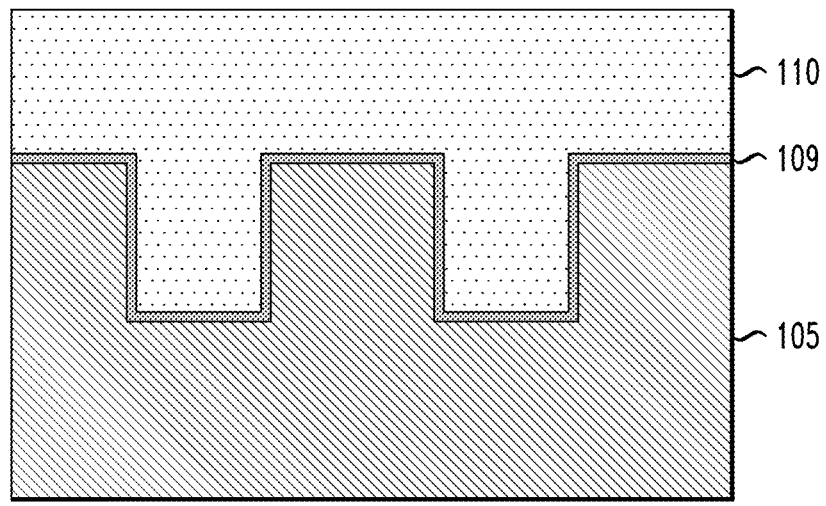
FIG. 3 is a cross-sectional view illustrating fabrication of a semiconductor device at a BEOL or MOL, and showing metal deposition, according to an exemplary embodiment of the present invention.

FIG. 3 is a cross-sectional view illustrating fabrication of a semiconductor device at a BEOL or MOL, and showing metal deposition, according to an exemplary embodiment of the present invention. Referring to FIG. 3, after the annealing, an electrically conductive layer 110 including, for example, nickel (Ni), cobalt (Co), iron (Fe), copper (Cu), gold (Au), silver (Ag), ruthenium (Ru), palladium (Pd), platinum (Pt), iridium (Ir), tungsten (W), and any mixtures or alloys thereof is deposited on the liner layer 109 (e.g., titanium nitride thin film) using deposition techniques, including, but not necessarily limited to, PVD, CVD, ALD or sputtering. The conductive layer 110 fills in the trenches 107 and is formed on the upper surface of the dielectric 105 including the liner layer 109 to a height above the top surface of the dielectric 105. Alternatively, the conductive layer 110 may not necessarily fill the entire trench 107, as in the case of electroplating, where a seed layer is deposited on the liner layer 109 prior to electroplating to form the conductive layer 110.

Figure 4:
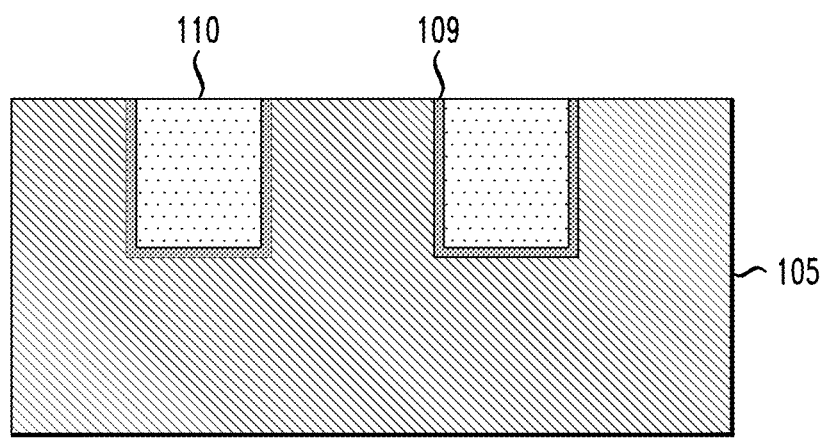
FIG. 4 is a cross-sectional view illustrating fabrication of a semiconductor device at a BEOL or MOL, and showing planarization, according to an exemplary embodiment of the present invention.

FIG. 4 is a cross-sectional view illustrating fabrication of a semiconductor device at a BEOL or MOL, and showing planarization, according to an exemplary embodiment of the present invention. Referring to FIG. 4, the layers 109 and 110 on the top surface of the dielectric 105 are polished off, using for example, a chemical mechanical planarization (CMP) process to planarize the top surface and result in structure shown in FIG. 4.

Figure 5:
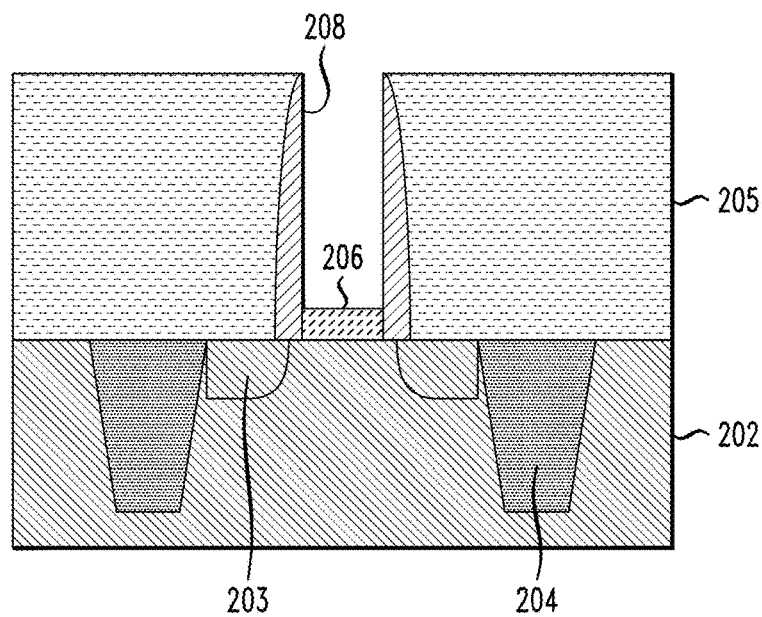
FIG. 5 is a cross-sectional view illustrating fabrication of a semiconductor device at a front-end-of-line (FEOL), and showing formation of a gate dielectric, according to an exemplary embodiment of the present invention.

FIG. 5 is a cross-sectional view illustrating fabrication of a semiconductor device at a front-end-of-line (FEOL), and showing formation of a gate dielectric, according to an exemplary embodiment of the present invention. Referring to FIG. 5, a FEOL structure includes a substrate 202, source/drain regions 203 and isolation regions 204, such as shallow trench isolation (STI) regions in the substrate 202.

The substrate 202 can be, for example, a bulk semiconductor substrate or a silicon-on-insulator (SOI) substrate including a buried insulating layer, such as, for example, a buried oxide or nitride layer located on an upper surface of the semiconductor substrate. The substrate 202 may comprise semiconductor material including, but not limited to, Si, SiGe, SiC, SiGeC or other like semiconductor. In addition, multiple layers of the semiconductor materials can be used as the semiconductor material of the substrate 202.

The isolation regions 204 can comprise dielectric material, including, but not limited to silicon dioxide (SiO$_2$), low-temperature oxide (LTO), high-temperature oxide (HTO), flowable oxide (FOX) or some other dielectric.

A dielectric layer 205, including, for example, silicon dioxide (SiO$_2$), carbon-doped silicon oxide (SiCOH), SiLK® dielectrics, or porous forms of these low-k dielectric films is formed on the substrate 202. Gate spacers 208, comprising for example, a dielectric insulating material including, but not necessarily limited to, silicon oxide, silicon nitride, silicon oxynitride, boron nitride, and/or silicon boron nitride, are formed in an opening in the dielectric layer 205. The spacers 208 isolate the resulting gate from the source/drain regions 203.

A gate dielectric 206 is formed between the spacers 208 corresponding to a channel region of a resulting gate. The gate dielectric 206 includes, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

Figure 6:
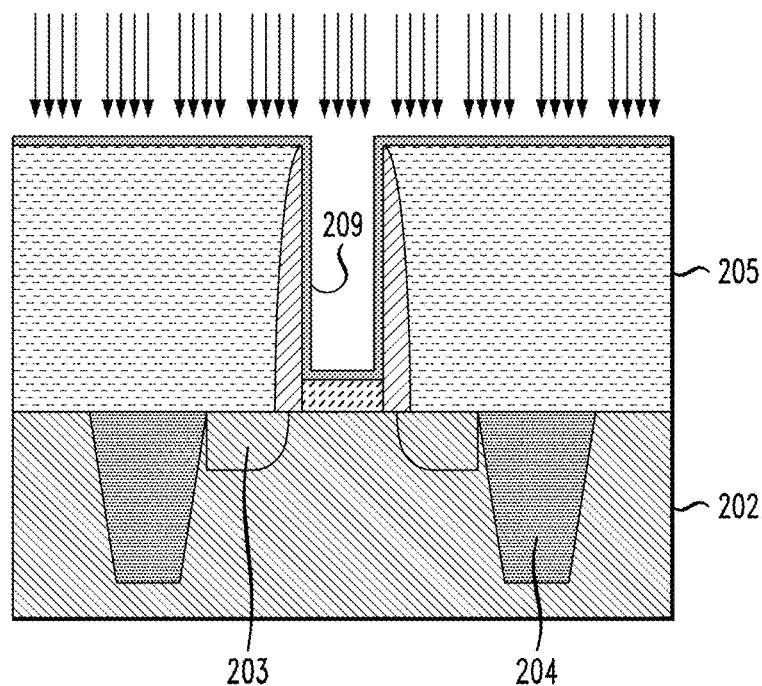
FIG. 6 is a cross-sectional view illustrating fabrication of a semiconductor device at a FEOL, and showing deposition of a liner layer followed by an annealing process to modify the liner layer, according to an exemplary embodiment of the present invention.

FIG. 6 is a cross-sectional view illustrating fabrication of a semiconductor device at a FEOL, and showing deposition of a liner layer followed by an annealing process to modify the liner layer, according to an exemplary embodiment of the present invention. Referring to FIG. 6, a liner layer 209 comprising, for example titanium nitride, or other liner material(s), is conformally formed on a top surface of the dielectric 205, and on the gate spacers 208 and a top surface of the gate dielectric 206. Deposition can be performed using, for example ALD. Other deposition processes, such as, for example, CVD or physical vapor deposition (PVD) may also be used. A thickness of the liner layer 209 (e.g., height in the vertical direction and width in the horizontal direction) can be, but is not necessarily limited to, about 5 angstroms to about 20 nm, for example, about 5 nm to about 10 nm.

As indicated by the arrows, following deposition of the liner layer 209, a plasma-based annealing procedure is performed on the liner layer 209 at a temperature of about 60° C. to about 500° C., for example, at about 100° C. to about 250° C., for about 1 minute to about 10 minutes, such as for example, about 2 minutes to about 5 minutes in, for example, a nitrogen ($N_2$) or ammonia ($NH_3$) ambient. The plasma-based annealing procedure is performed using about 200 Watts (W) to about 4500 W of power, for example, about 500 W to about 2000 W.

Figure 7:
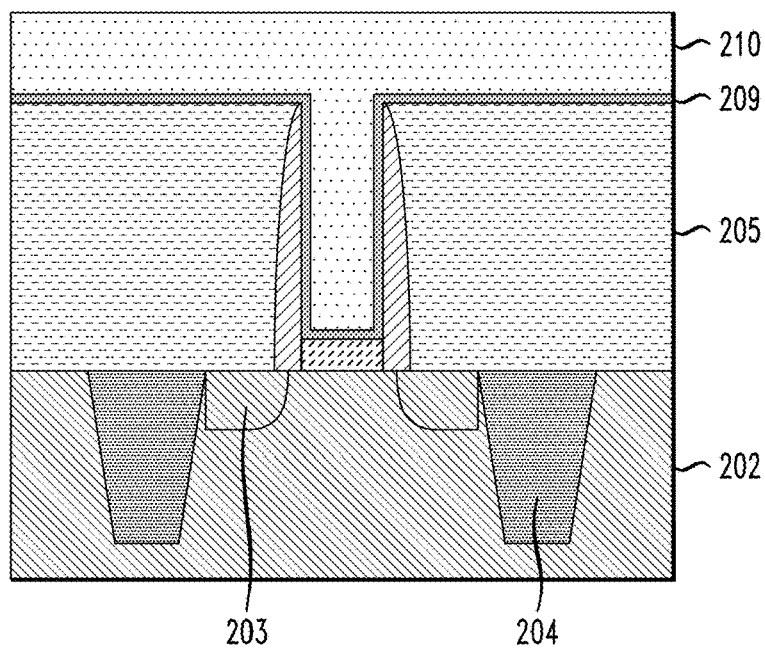
FIG. 7 is a cross-sectional view illustrating fabrication of a semiconductor device at a FEOL, and showing gate deposition, according to an exemplary embodiment of the present invention.

FIG. 7 is a cross-sectional view illustrating fabrication of a semiconductor device at a FEOL, and showing gate deposition, according to an exemplary embodiment of the present invention. Referring to FIG. 7, after the annealing, an electrically conductive layer 210 (e.g., gate layer) including, but not necessarily limited to, amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof is deposited on the liner layer 209 (e.g., titanium nitride thin film) using deposition techniques, including, but not necessarily limited to, PVD, CVD, ALD or sputtering. The conductive layer 210 fills in the space between the spacers 208 and conformal liner layer 209, and is formed on the upper surface of the dielectric 205 including the liner layer 209 to a height above the top surface of the dielectric 205. Alternatively, the conductive layer 210 may not necessarily fill the entire space between the spacers 208, as in the case of electroplating, where a seed layer is deposited on the liner layer 209 prior to electroplating to form the conductive layer 210.

Figure 8:
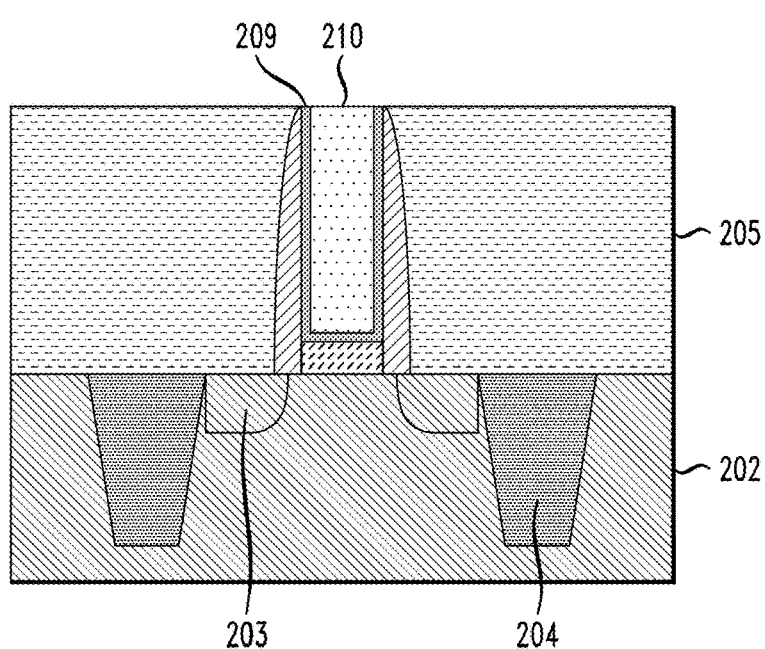
FIG. 8 is a cross-sectional view illustrating fabrication of a semiconductor device at a FEOL, and showing planarization, according to an exemplary embodiment of the present invention.

FIG. 8 is a cross-sectional view illustrating fabrication of a semiconductor device at a FEOL, and showing planarization, according to an exemplary embodiment of the present invention. Referring to FIG. 8, the layers 209 and 210 on the top surface of the dielectric 205 are polished off, using for example, a chemical mechanical planarization (CMP) process to planarize the top surface and result in structure shown in FIG. 8. The gate dielectric 206, gate spacers 208, liner layer 209, and conductive layer 210 may be formed in a replacement metal gate (RMG) process.

The post deposition annealing procedure in accordance with embodiments of the present invention, reduces organic impurities, resulting in a high density of the liner layer, for example, a density that is greater than 4.5 $g/cm^3$ in the case of a TiN film. Density values may differ for other films including different materials. In addition, according to embodiments of the present invention, a more consistent stoichiometry (e.g., ratio of titanium to nitrogen in the case of a TiN film) is observed in the plasma-treated films.

According to non-limiting embodiments of the present invention, surface layer thickness of a thin film liner layer is decreased, and the surface layer density of a thin film liner layer is increased after the plasma-based annealing procedure. In addition, in accordance with non-limiting embodiments of the present invention, both the bulk layer thickness and density of a thin film liner layer are increased after the plasma-based annealing procedure.

It is to be understood that the results described in connection with plasma-based post deposition annealing described in accordance with embodiments of the present invention, can be applicable to each of the BEOL, FEOL or MOL configurations described herein.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
a dielectric layer;
an opening formed in the dielectric layer;
a liner layer on sidewall and bottom surfaces of the opening; and
a conductive layer on the liner layer in the opening;
wherein the liner layer comprises titanium nitride;
wherein a bottom portion of the liner layer on the bottom surface of the opening directly contacts a first dielectric material and side portions of the liner layer on the sidewall surfaces of the opening directly contact a second dielectric material different from the first dielectric material; and wherein the liner layer is a halogen diffusion barrier.

2. The semiconductor device according to claim 1, wherein the liner layer and the conductive layer form at least part of an interconnect.

3. The semiconductor device according to claim 1, wherein the liner layer and the conductive layer form at least part of a gate structure.

4. The semiconductor device according to claim 3, wherein the liner layer is formed on a gate dielectric.

5. The semiconductor device according to claim 3, wherein the liner layer is formed on a gate spacer.

6. The semiconductor device according to claim 1, wherein a thickness of the liner layer is in a range of about 5 angstroms to about 20 nm.

7. The semiconductor device according to claim 6, wherein a thickness of the liner layer is in a range of about 5 nm to about 10 nm.

8. The semiconductor device according to claim 1, wherein the liner layer further is an oxygen diffusion barrier.

9. The semiconductor device according to claim 1, wherein the liner layer further is a copper diffusion barrier.

10. The semiconductor device according to claim 1, wherein the liner layer further is an oxygen, halogen and copper diffusion barrier.

11. A semiconductor device, comprising:
a dielectric layer;
an opening formed in the dielectric layer;
a liner layer conformally formed on a plurality of surfaces of the opening; and
a conductive layer on the liner layer in the opening;
wherein the liner layer comprises titanium nitride;
wherein a bottom portion of the liner layer on a bottom surface of the opening directly contacts a first dielectric material and side portions of the liner layer on sidewall surfaces of the opening directly contact a second dielectric material different from the first dielectric material; and wherein the liner layer is a halogen diffusion barrier.

12. The semiconductor device according to claim 11, wherein the liner layer and the conductive layer form at least part of an interconnect.

13. The semiconductor device according to claim 11, wherein the liner layer and the conductive layer form at least part of a gate structure.

14. The semiconductor device according to claim 11, wherein a thickness of the liner layer is in a range of about 5 angstroms to about 20 nm.

15. The semiconductor device according to claim 14, wherein a thickness of the liner layer is in a range of about 5 nm to about 10 nm.

16. The semiconductor device according to claim 11, wherein the liner layer further is an oxygen diffusion barrier.

17. The semiconductor device according to claim 11, wherein the liner layer further is a copper diffusion barrier.

18. The semiconductor device according to claim 11, wherein the liner layer further is an oxygen and copper diffusion barrier.

* * * * *